(12) United States Patent
Fraivillig

(10) Patent No.: US 10,035,936 B2
(45) Date of Patent: Jul. 31, 2018

(54) A-STAGED THERMOPLASTIC-POLYIMIDE (TPI) ADHESIVE COMPOUND AND METHOD OF USE

(71) Applicant: James B. Fraivillig, Boston, MA (US)

(72) Inventor: James B. Fraivillig, Boston, MA (US)

( * ) Notice: Subject to any disclaimer, the term of this patent is extended or adjusted under 35 U.S.C. 154(b) by 0 days.

(21) Appl. No.: 14/955,168

(22) Filed: Dec. 1, 2015

(65) Prior Publication Data

US 2016/0333238 A1 Nov. 17, 2016

Related U.S. Application Data

(60) Provisional application No. 62/123,850, filed on Dec. 1, 2014.

(51) Int. Cl.
*C09J 179/08* (2006.01)
*H01L 23/00* (2006.01)
(Continued)

(52) U.S. Cl.
CPC .......... *C09J 179/08* (2013.01); *C08G 73/105* (2013.01); *C08G 73/1067* (2013.01); *C08G 73/1071* (2013.01); *C09J 5/06* (2013.01); *H01L 23/3737* (2013.01); *H01L 24/29* (2013.01); *H01L 24/83* (2013.01); *C08K 3/08* (2013.01); *C08K 3/22* (2013.01); *C08K 3/38* (2013.01); *C08K 7/24* (2013.01); *C08K 2003/0806* (2013.01); *C08K 2003/2227* (2013.01); *C08K 2003/385* (2013.01); *C08K 2201/001* (2013.01); *C09J 2479/08* (2013.01); *H01L 24/03* (2013.01); *H01L 24/27* (2013.01); *H01L 24/32* (2013.01); *H01L 24/75* (2013.01); *H01L 2224/0381* (2013.01); *H01L 2224/04026* (2013.01); *H01L 2224/2731* (2013.01); *H01L 2224/2919* (2013.01); *H01L 2224/2929* (2013.01); *H01L 2224/29082* (2013.01); *H01L 2224/29339* (2013.01); *H01L 2224/29387* (2013.01); *H01L 2224/29499* (2013.01); *H01L 2224/32245* (2013.01); *H01L 2224/75251* (2013.01); *H01L 2224/75272* (2013.01); *H01L 2224/8309* (2013.01); *H01L 2224/83022* (2013.01); *H01L 2224/8388* (2013.01); *H01L 2224/83204* (2013.01); *H01L 2224/83211* (2013.01); *H01L 2224/83424* (2013.01);
(Continued)

(58) Field of Classification Search
CPC ...................................................... C09J 179/08
See application file for complete search history.

(56) References Cited

U.S. PATENT DOCUMENTS

| | | | | |
|---|---|---|---|---|
| 5,480,965 A | * | 1/1996 | Yamashita | C08G 73/10 428/411.1 |
| 5,851,616 A | * | 12/1998 | Oka | C09J 7/0242 257/E21.505 |
| 7,541,203 B1 | * | 6/2009 | Knickerbocker | H01L 21/67132 257/E21.521 |

\* cited by examiner

*Primary Examiner* — Daniel H Lee
(74) *Attorney, Agent, or Firm* — John M. Brandt

(57) ABSTRACT

A compound and method of use thereof consisting of an A-staged thermoplastic-polyimide (TPI) adhesive, a viscous uncured liquid of polyamic-acid polymer (PAA), the TPI precursor, synthesized and dissolved in a polar aprotic organic solvent, and including, as appropriate, combinations of particulate ceramic and/or metallic thermally conducting, electrically insulating, and thermally conducting, electrically conducting fillers for interface-bonding to create a robust joint between surfaces with conventional lamination processes that utilize relatively moderate temperatures and applied pressures.

4 Claims, 1 Drawing Sheet

(51) Int. Cl.
    *C09J 5/06*     (2006.01)
    *H01L 23/373*     (2006.01)
    *C08G 73/10*     (2006.01)
    C08K 3/22     (2006.01)
    C08K 3/38     (2006.01)
    C08K 3/08     (2006.01)
    C08K 7/24     (2006.01)

(52) U.S. Cl.
    CPC ................ *H01L 2224/83856* (2013.01); *H01L 2224/83862* (2013.01); *H01L 2224/83885* (2013.01); *H01L 2224/83907* (2013.01); *H01L 2924/07025* (2013.01); *H01L 2924/1033* (2013.01); *H01L 2924/10272* (2013.01); *H01L 2924/15724* (2013.01); *H01L 2924/3641* (2013.01)

A-STAGED THERMOPLASTIC-POLYIMIDE (TPI) ADHESIVE COMPOUND AND METHOD OF USE

CROSS REFERENCE TO RELATED APPLICATIONS

This application is based on a provisional application Ser. No. 62/123,850 filed Dec. 1, 2014 by the same inventor and is hereby incorporated by reference.

BACKGROUND OF THE INVENTION

Field of the Invention

This invention relates to thermoplastic adhesives and more particularly to thermoplastic-polyimide (TPI) A-staged adhesives.

Description of the Prior Art

The employment of partially cured (B-stage) or fully cured (C-stage) TPI compounds disposed on substrates as adhesives are known in the prior art. However, as best known to the inventor, it is unknown to use the precursor of these compounds in an uncured (A-stage) state, either with or without suitable fillers for bonding purposes by applying the uncured TPI precursor in liquid form (A-stage) directly to the surfaces to be joined and thereafter curing entirely In Situ or at the site.

As described below the use of the A-staged TPI adhesive of the invention may be particularly useful in, for example, the fields of lamination of a semiconductor die to an aluminum heat sink (die-attachment) for thermal management of high-power electronic packaging and, additionally, the bonding of superconducting coils.

Die-attachment on CTE Mismatched Heat Sink for Thermal Management

A lamination of a semiconductor die to an aluminum heat sink is common in high-power applications, as the heat sink dissipates the heat generated from the semiconductor. As the laminated materials typically have severely mismatched coefficients of thermal expansion (CTE), for example, aluminum (~23 ppm/° C.) and semiconductor (~3-8 ppm/° C.), the bondline between the die and the heat sink undergoes significant interlaminar stress during the temperature excursions of processing and use. The failure of the bondline between the semiconductor and the heat sink will dramatically reduce thermal transfer between the surfaces, leading to overheating and failure of the semiconductor.

For simplicity, only die-attachment directly to an aluminum heat sink is discussed. This TPI technology also applies to bondlines of other interlayers between the semiconductor and aluminum, which are commonly used to stepdown CTE mismatch between the semiconductor and the aluminum heat sink. These interlayers can provide submount substrates for the semiconductor die or dice, as well as a CTE buffer between the semiconductor and the aluminum heat sink. Interlayers could include ceramics such as alumina, $Al_2O_3$, CTE of 7 ppm/° C., and aluminum nitride (AlN), CTE of 4.6, among others; metals such as copper, CTE of 17, among others; printed circuit boards such as FR4 glass/epoxy, CTE of 12, among others; and various composite materials such as AluminumSiliconCarbide (AlSiC), CTE of 7-11, among others.

Conventional die-attachment is often done with thermoset epoxy polymers that have been filled with metal powder to enhance its thermal conductivity. Often, electrical conductivity of the die-attach bondline is also critical. These thermoset epoxy polymers are brittle (both unfilled and especially filled), and so the die-attach epoxy bondline is designed to withstand the inter-laminar stress without inducing cracks in the epoxy, which would propagate with time and temperature cycling. Reducing the thickness of the bondline would exponentially increase the inter-laminar stress between the die and heat sink, and so epoxy bondlines have a minimum dimension of 0.7-1.5 mil (18-35 um).

To maximize thermal transfer and potentially electrical transfer between the die and heat sink, highly conductive metal powders, such as silver or copper, are compounded into A-staged epoxy resin. The concentration of these metal powders can reach 80% by weight or more, as solids in the cured bondline. As silver is a precious metal, and is often used in a costly micro-sized or even nano-sized format, the cost component of the metal in the bondline is significant, especially when the bondline needs to have a thickness of 1-mil (25 um) or more.

When thermal conductivity, but not electrical conductivity, of the die-attach bondline is desired, ceramic powders are used as fillers in epoxy bondlines. Ceramic powders, such as alumina and boron nitride, are high thermal-conductivity dielectrics.

In processing, the die-attach epoxy is applied to the heat sink surface manually or with an automated dispenser. The semiconductor die is then precisely placed onto the epoxy. The subassembly's bondline is then cured with heat, in a controlled manner that allows outgassing and avoids voiding. Some pressure may be applied.

The use of A-staged TPI polymer has the following advantages in die-attach over the epoxy technology described above:

TPI polymer will not crack, allowing much thinner bondlines between CTE mismatched surfaces and potentially enabling higher loadings of metal particles, which would further embrittle the already brittle cured epoxy.

Thinner die-attach bondlines will enable higher thermal and electrical transfer between the die and the heat sink.

Thinner die-attach bondlines will utilize much less material, providing substantial cost savings.

While epoxy die-attach bondlines have a maximum temperature rating of 175° C. or less, TPI bondlines can operate continuously at well above 300° C. This will become increasingly important with the transition to wide band-gap semiconductors, such as SiC and GaN, which can operate very efficiently at high temperature.

Die-attachment can also be done with eutectic solders, in pre-forms or as paste, compounded with an organic flux that prevents oxidation of the surfaces at high temperature and promotes surface wet-out, ensuring an optimal bondline. The solder die-attach is very electrically and thermally conductive, and provides a robust ductile bondline that provides a buffer between CTE-mismatched surfaces.

These high-performance solders are generally made with precious metals, such as silver (Ag) and gold (Au), and require extreme reflow temperatures, such as 363° C. for AuSi, for die-attachment. The precious-metal solders generally have bondline thicknesses in the 1-10 mil (25-250 um) range. As aluminum heat sinks do not provide a readily solderable surface, the targeted aluminum area requires a metal plating or braising of a precious metal to ensure a robust solder joint between the semiconductor die and the heat sink. This primer metallization is generally 0.08-0.15 mil (2-4 um). Both the raw materials and required processes for eutectic solder die-attachment are very costly.

In addition, sintered-silver technology is now used widely for die-attach. Micro- and nano-sized silver particles are used in a relatively thick bondline, generally 50 um or more, often with a polymeric binder. Due to the extremely small size of the silver particles, they will sinter to adjacent particles at process temperatures (200-300° C.) well below the melting temperature of silver (962° C.), and form a robust, relatively ductile bondline between the die and heat sink. High pressure applied to the die during sintering lamination is often required. Priming the die and/or heat sink is required.

In contrast to the prior art using precious-metal bondlines, the use of A-staged TPI polymer has the following advantages in die-attach operations over precious metal solder technology described above:

The material cost of the TPI polymer is much lower than precious-metal solder;

The equipment requirements and process cost of the TPI bondline is lower than the process cost of precious metal solder or sintering;

Much lower temperatures are utilized in curing the TPI than in reflowing the precious-metal solder;

Lower temperature and/or pressure is required for TPI lamination, which alleviates applied stresses on the semiconductor, and TPI generally does not require a prime coat to bond to aluminum. The precious-metal plating or braising of the aluminum surface to be bonded is expensive in both material and process cost. When priming of a metal surface is required to ensure a robust bondline, a simple wipe with the A-staged TPI liquid and then quick bake to drive off the solvent and B-stage the polymer suffices.

Superconducting Magnet Coil Insulation and Bonding

Superconducting magnet coils operate at cryogenic temperatures, generate very high stress within their structure due to the required temperature excursions, and often need be highly radiation-resistant, due to their application environment.

Polyimide polymers, both in film form, for example, DuPont Kapton® and Kaneka Apical®, and in TPI C-stage adhesive form have long been used for superconducting magnet coil insulation and bonding, as polyimides have among the highest radiation-resistance of any polymer. Superconductors are made with metal alloys that are reacted at very high temperature, as high as 900° C., to provide their superconductivity. These process temperatures would, of course, destroy any organic-polymeric components.

In react-and-wind superconductors, such as Niobium-Titanium (NbTi), the superconductor wire is ductile and can be handled like an ordinary copper wire after its high-temperature reaction processing. Therefore, its cable form can be wrapped with polyimide film. This polyimide insulation would have an adhesive coating, such as epoxy. The cable can then be wound into the desired coil and bonded into precise shape with a high-pressure, elevated-temperature lamination.

These NbTi magnets are by far the most common in today's particle accelerators, such as CERN's Large Hadron Collider and Brookhaven National Lab's Relativistic Heavy-Ion Collider. However, to obtain higher magnet fields for specific experiments on these rings, a superconductor that can carry much more electric current than the NbTi cables is required, i.e., Niobium-Tin ($Nb_3Sn$).

$Nb_3Sn$ is a wind-and-react superconductor. After its ultra-high-temperature reaction, it becomes extremely brittle and cannot be bent or wound, as it would readily crack. Therefore, the desired $Nb_3Sn$ coil must be pre-wound before the reaction process, with glass fabric separating the individual conductors as glass can survive the high-temperature reaction process.

After the reaction, the now-superconducting $Nb_3Sn$ coil is impregnated with an A-staged liquid polymer that serves as both an insulation and a bonding agent. Thermoset epoxy, such as CTD 101 resin from Composite Technologies Development, Inc of Lafayette, Colo., has served as the baseline coil-impregnation; thermoset polyimide, such as Matrimid resin from Huntsman Corporation of Houston, Tex., has also been considered, due to its higher radiation-resistance.

These thermosets are all very brittle, and crack with the inevitable downstream handling and operation, reducing the glass plus thermoset insulation layer to only about 100 V/mil, which is the dielectric strength of air. In addition, the 'cracking nature' of the thermosets causes quenching issues with the assembled coils, which will shift slightly when reaching an increased level of power, causing a crack in the brittle thermoset installation, releasing enough energy to eliminate superconductivity in the adjacent $Nb_3Sn$ cables, i.e., a quench. This area quickly becomes a hot spot in the coil, and the magnet must be shut down and restarted, which is a laborious and time-consuming process. An individual superconducting magnet needs to reach a specific power level, therefore multiple quenches of often as many as 20-50 cycles are sometimes required. This process is called "training" the magnet.

In contrast to the prior art, TPI polymers are ductile and crack-resistant, even at cryogenic temperatures, and, as such, $Nb_3Sn$ superconducting coils that are vacuum-impregnated with an A-staged TPI solution, which is then dried and cured at high temperature, will not exhibit significant loss-of-dielectric properties, nor require extensive training to reach their required power levels. The impregnation of the coils can be assisted by heating the A-staged TPI solution which dramatically decreases its viscosity. The polymer in the A-staged TPI solution is stable even at impregnation temperatures up to 200° C.

Superconducting magnet bondlines made with insulation impregnation of A-staged TPI solution will have significant performance advantages over conventional thermoset dielectric/adhesive systems including:

The structural and dielectric integrity of the coil will be much higher;

No cracking will occur and, therefore considerable less training will be required; and Higher radiation resistance will be obtained.

SUMMARY OF THE INVENTION

The invention may be summarized as both the product and the use of an A-staged thermoplastic-polyimide (TPI) adhesive, a viscous liquid with polyamic-acid polymer (PAA), the TPI precursor, synthesized and dissolved in a polar aprotic organic solvent for interface-bonding to create a robust joint between surfaces with conventional lamination processes that utilize relatively moderate temperature and applied pressure. Utilizing A-staged TPI adhesive maximizes the polymer's flow and reactivity allowing lamination of surfaces at temperatures and pressures well below what is required to bond that same TPI layer when approaching a fully cured state. The minimized temperature and pressure required for bonding dramatically reduces the required processing conditions and equipment, as well as the stress applied to the laminated surfaces. Moderated process conditions are critical in many applications, for instance, the attachment of semiconductor die and power devices to heat sinks described above, to eliminate the high temperatures and pressures that could which damage delicate semiconductor components.

The cured thermoplastic polyimide (TPI) bondline is very thin and durable in tensile and shear strength, across a wide range of conditions and exposures, as opposed to those of thermosets, which are by comparison quite brittle. This is especially true even with laminates of dissimilar materials and mismatched coefficients-of-thermal-expansion (CTE). For example, the TPI bondline can withstand harsh thermal shocks up to a temperature variance of 400° C. and extreme temperature exposure, without structural or dielectric degradation. For example, extreme temperature exposure can include cryogenic temperature down to liquid Helium, −269° C., greater than 300° C. continuously and greater than 400° C. for short periods of time.

This relative thinness also allows the optimization of thermal and electrical conductivity across the bondline, minimizing material cost, an extremely important factor for coatings with precious-metal compounding.

Additionally, TPI bondlines have a wide range of useful applications ranging from electronic packaging and superconducting magnets, to jewelry and art. For example, TPI can robustly bond ceramic and glass-like materials to metal surfaces.

In addition, TPI polyimide structure provides excellent chemical resistance.

The following are relevant characteristics and properties of the invention:

A-staged TPI adhesive utilizes polyamic-acid (PAA) polymer synthesized and dissolved in a low-solids solution with polar aprotic solvent. PAA is the precursor to thermoplastic polyimide (TPI) polymer.

A-staged TPI adhesive is a one-part system. As opposed to the two-part high-performance epoxy adhesives, A-staged TPI adhesive is very stable. At room temperature, its pot-life is measured in days; when kept in a freezer, its shelf-life is indefinite.

The liquid A-staged TPI adhesive can be compounded with fillers to tailor the properties of the bondline.

The viscosity of A-staged TPI adhesive is highly dependent on temperature. This characteristic could be helpful in the dispensing of the material onto surfaces.

The PAA polymer dissolved in the A-staged TPI adhesive is stable at solution temperatures of up to 200° C. for short periods.

A-staged TPI adhesive can be applied to a bond joint (2-25 um, dry), even between materials with dissimilar CTEs.

A coating of A-staged TPI can be partially cured (B-staged) with heat in a bondline, evaporating the majority of the solvent and converting some of the PAA to TPI.

Solvent activity in the bondline can be beneficial in ensuring wetting with the laminating surfaces. Micro-scouring of the bondline surfaces may also be beneficial. Evaporating solvent can assist the removal of air from a TPI bondline.

When the solvent is largely removed, the PAA polymer in the coating gradually converts to TPI polymer, releasing water vapor, which should be allowed to escape the bondline. It is critical to manage this phenomenon to avoid blistering.

These and other characteristics and advantages of the invention will be further understood from the description of the preferred embodiment in conjunction with the drawings which follow.

DESCRIPTION OF THE PREFERRED EMBODIMENT

Figure 1:
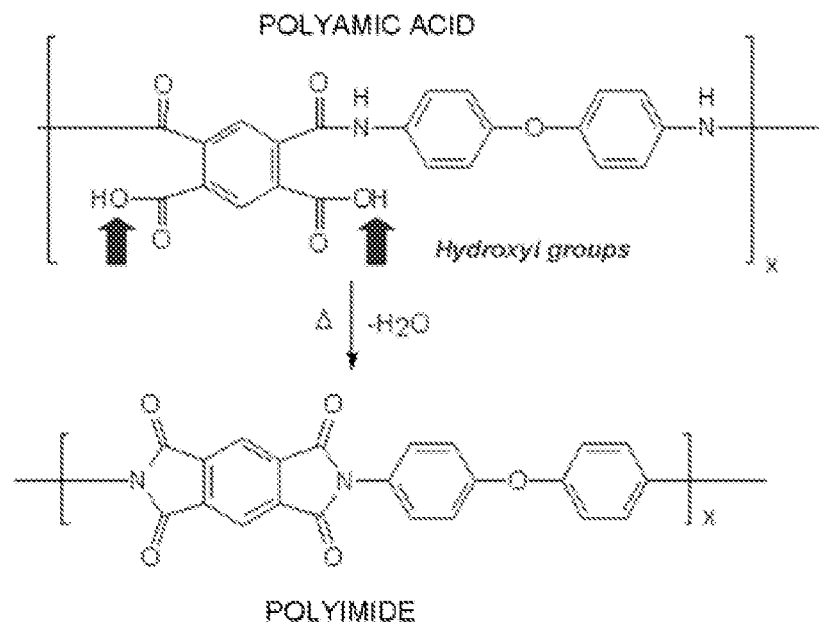
FIG. 1 is a schematic drawing of the chemical process of the invention.

TPI coatings are made by polymerizing polyamic-acid (PAA) polymer in polar aprotic solvents, such as NMP (N-methylpyrrolidone), DMAc (dimethylacetamide), and DMF (dimethylformamide). The PAA's solids concentration can be 5-40% in solution (by weight), and commonly 15-25%. TPI-PAA solutions are a one-part adhesive, and very stable when kept in a freezer or left out at room temperature for a few days.

Typical TPI diamine can be, for example, one or more of the following monomers: 3,5-diaminobenzoic acid (DABA), 3,3'-diaminobenzophenone (3,3'-DABP), 3,4'-diaminobenzophenone (3,4'-DABP), diester diamine (RDEDA), 1,3-bis-(4-aminophenoxy) benzene (TPER), 3,4'-oxydianiline (3,4'-ODA), 4,4'-oxydianiline (4,4'-ODA), 4,4'-methylene dianiline (4,4'-MDA), an aliphatic diamine, or a silicone-diamine among others.

Typical TPI dianhydride can be one or more of the following monomers: 3,3', 4,4'-biphenyltetracarboxylic dianhydride (BPDA), 3,3', 4,4'-benzophenone tetracarboxylic dianhydride (BTDA), 4,4'-oxydiphthalic anhydride (ODPA), pyromellitic dianhydride (PMDA), or 2,2'-bis-(3, 4-dicarboxyphenyl) hexafluoropropane dianhydride (6FDA) among others. TPI-precursor solutions, polyamic-acid polymer in solution, are also available commercially, such as LARC-TPI or Fraivillig Technologies FM901 solutions.

TPI coatings can be compounded with powder or particulate fillers such as ceramic, metal and pigments to tailor the properties of the bondline. On a solids basis, fillers can be compounded from 5-98% (by weight) into the TPI polymer. There are many fillers that could be used to optimize the properties of a TPI bondline, but these examples will cover a large majority of applications. Representative thermally conductive, electrically insulating inorganic fillers for loading A-staged (liquid precursor) thermoplastic polyimide (TPI) include:

Boron nitride (BN) powder and flake, available from Momentive Performance Materials Inc., Strongsville, Ohio;

Alumina fumed powder, available from Evonik Industries AG, Parsippany, N.J., and Cabot Corporation, Billerica, Mass.; and Boron nitride (BN) nano-tubes, available from Tekna Advanced Materials Inc., Sherbrooke, Quebec.

These fillers can be combined to optimize properties, such as BN platelets (which are relatively large, a few microns) with fumed alumina (which is submicron), as this maximizes the amount of property changing ceramic. Representative thermally conductive, electrically conductive inorganic fillers include:

Silver (Ag) flake, available from Metalor Technologies SA, North Attleboro, Mass.

The TPI coating can be applied to surfaces to be bonded with a range of conventional technologies, even a simple wipe. The viscosity of the TPI-PAA solution is very sensitive to temperature, yet stable, a feature which can be utilized in tailoring for a specific application of the TPI coating.

Pre-treatment of the surfaces to be coated, such as corona, plasma, or flame treatment, may improve the wetting of the TPI coating and eventual adhesion of the cured TPI bondline, but is often not required.

The surfaces to be bonded are then assembled together, ensuring excellent contact between them. Pressure can be applied mechanically to ensure intimacy. It may be a goal to minimize applied pressure, as that can result in residual stress in the finished laminate.

The TPI coating is tacky as a liquid at room temperature before the drying and curing process. As it dries, resulting in solvent evaporation, the partially dried coating will be naturally tacky at temperatures above what was the previous maximum process temperate for a short period until the solvent evaporates to its new equilibrium within the polymer matrix. This tacky feature may be advantageous in assembly operations.

Since liquid TPI coatings are relatively low-solids, typically 15-25%, the initial thickness of the bondline in processing will be much greater than the finished cured bondline. Using a TPI coating solids of 20%, the final TPI bondline would be less than $\frac{1}{7}^{th}$ the initial wet thickness. The final cured thickness of a TPI bondline can be 1-20 um. Assuming a solids-level of 20%, the initial A-staged bondline would be approximately 7-140 um.

Heat is then applied to drive off the solvent and cure the TPI polymer in a bondline made with TPI coating. This process can be done with conventional ovens, vacuum ovens and hot plates.

Depending on the application, heat can be increased gradually over a controlled cycle or can be applied quickly, such as when placing an assembly on a hot plate.

As the TPI coating within the bondline heats up, its viscosity drops significantly and the solvent begins to evaporate. These actions can facilitate surface wetting of the laminate, which can optimize the finished bondline for strength and intimacy. It is important to note that the polar aprotic solvent has relatively low surface tension, which facilitates its evacuation from a bondline as a vapor without significant bubbling as opposed to water.

Before it evaporates, the activity of the aggressive polar aprotic solvent at elevated temperatures can be beneficial to the final bondline, as the solvent scours the surfaces to be bonded.

As the TPI bondline approaches 100° C., the solvent begins to evaporate and evacuate the bondline. The effect escalates as the bondline temperature increases. During this time, the solvent vapor can purge the bondline of residual air.

Figure 2:
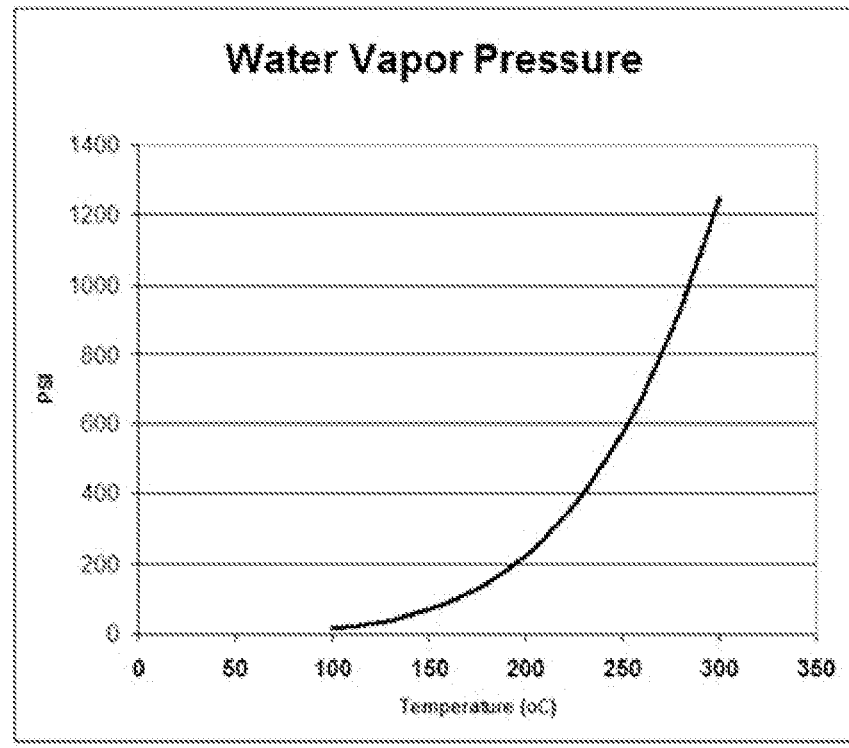
FIG. 2 is a graph relating two parameters of the operation of the invention.

When most of the solvent has evaporated, i.e., when the bondline is at 180-200° C., the PAA polymer will start converting to TPI, which is a condensation reaction that evolves water vapor as shown in FIG. 1. This water vapor will have a very high vapor pressure, which is considerably higher than applied pressure on the laminate, so the water will escape cleanly as shown in FIG. 2.

After the conversion to TPI, there will be no additional evolution of water, and the micro-channels from which the water vapor escaped will collapse.

Maximum process temperature that the TPI bondline should see is dependent on the application. For moderate temperature applications, the process temperature should be 10-20° C. above the expected maximum downstream temperature in manufacturing or use. For high temperature applications, such as 300° C. and above, the maximum process temperature of the bondline should ensure that the TPI polymer is fully cured, as no additional water would be evolved.

After the water outgassing, at or near the maximum process temperature, additional pressure can then be applied to ensure the adhesion and intimacy of the bondline. Duration of the pressure is not typically a factor with TPI bondlines, which is helpful in minimizing process time.

TPI bondline assembly can be assisted with vacuum lamination, which helps the removal of evaporating solvent and water evolved from the PAA's condensation reaction to PI.

An A-staged TPI coating in contact with an existing B-staged TPI surface will allow the B-staged coating to absorb a portion of the solvent in the A-stage coating, which solidifies that bondline over time, if only temporarily, until full curing at high temperature. The same solvent-absorption effect is seen with lesser B-staged TPI coating i.e., less cure, more solvent, on greater B-staged TPI coating i.e., more cure, less solvent. This mating effect of surfaces with similar chemistry, but dissimilar phase states (A-stage vs. B-stage; less B-stage vs. more B-stage) enables temporary mating of surfaces, with full lamination at the final cure at higher temperatures.

As long as there is enough pressure to ensure contract between the lamination surfaces, then tooling and the applied pressure can be minimized during the lamination process. This ensures that minimal internal stresses are inherent in the laminate when it cools from the process temperature. When the laminated assembly heats back up towards its maximum process temperature during downstream processing and operation the internal stresses will be reduced.

Assessing and monitoring the level of TPI cure can be critical to ensure properties and avoid further polymer reaction from causing blistering, when the part sees elevated temperature. This is especially important in applications where the expected temperature is above the final TPI-cure temperature. Cure level of the TPI polymer can be assessed accurately by monitoring the electrical-resistivity (ion-viscosity) of the bondline; the precursor PAA polymer has a low resistivity; TPI has a high resistivity.

The TPI coating can be applied to one or both surfaces to be bonded. TPI coating(s) can be partially cured or B-staged, which gives the coating stability at room temperature and ensures consistent thickness with high temperature lamination (greatly reduced squeeze-out with applied pressure).

B-staged TPI adhesive coatings are stable at room temperature and have an indefinite shelf life. This facilitates the manufacturing and storage of TPI products and intermediate-process assemblies.

B-staged TPI adhesive coatings and bondlines may have residual solvent (10-50%), but will act as a solid at room temperature.

The effective glass-transition temperature (Tg) of B-staged TPI coatings and bondlines is the highest temperature that that polymer has experienced in previous processing. Above this temperature, the B-staged TPI will soften and become tacky again, which may assist assembly. As further solvent is lost and additional PAA polymer converted to TPI, the effective Tg of the B-staged TPI coatings and bondlines increases.

Surfaces to be bonded with TPI can be pre-primed with A-staged TPI adhesive which would then be B-staged, before being bonded by additional A-staged TPI adhesive.

During high-temperature TPI lamination, it is critical that the surfaces are in intimate contact, as the bondlines are relatively thin (2-10 um, typically).

Pressure can be applied with hardware or platen. Less pressure locks in less inherent stress between the lamination layers. Even the lamination of surfaces with no applied pressure, i.e., just the force of gravity on the stacked parts, can be an effective bondline. Assembly clips and other hardware can apply pressures of 1-50 psi during TPI lamination. This moderate pressure allows the solvent and evolved water vapor (which has a very high vapor-pressure at high-temperature TPI lamination) to evacuate the bondline.

The maximum TPI lamination curing process temperature is application dependent. If the dielectric properties of the TPI do not require high dielectric strength or resistivity (residual PAA is low in both, but has good structural properties), then a maximum temperature of 150-200° C. will suffice. If the dielectric properties are critical, then a higher maximum temperature of 200-300° C. is recommended. Maximum lamination temperature should be 10-20° C. above the highest expected downstream process or application temperature. If the expected downstream process or application temperature is extremely high (300-450° C.), then it is critical that full curing of the TPI bondline is ensured, through both process temperature and cure time. If the TPI is not fully cured, then encountering higher temperatures will result in additional water outgassing from subsequent curing of PAA to TPI at very high vapor pressure, which results in blistering and delamination.

Dwell time will be application dependent. The PAA polymer cures faster to TPI at elevated temperature.

Full curing of a TPI bondline can be determined with the polymer's electrical-resistivity (ion-viscosity) measurement.

Accordingly, the invention described above is defined by the following claims.

What is claimed is:

1. The process of interface bonding of two surfaces forming a bondline, said process comprising in combination:
    A. providing an adhesive solution comprising an A-staged uncured thermoplastic-polyimide (TPI), said thermoplastic polyimide having the characteristic of being insoluble in an organic solvent in the fully imidized, fully cured state, in the form of a viscous liquid solution containing in combination:
        1. a quantity of polar aprotic organic solvent;
        2. a quantity of TPI precursor polyamic-acid polymer (PAA) synthesized and dissolved in said solvent wherein said polyamic-acid polymer comprises a mixture of diamine and dianhydride monomers, and wherein
    said diamine monomer is selected from the group consisting of 3,3'-diaminobenzophenone (3,3'-DABP), 3,4'-diaminobenzophenone (3,4'-DABP), 1,3-Bis (4-aminophenoxy) benzene (TPER), 3,4'-Oxydianiline (3,4'-ODA), 4,4'-Oxydianiline (4,4'-ODA), 4,4'-Methylene dianiline (4,4'-MDA), an aliphatic diamine, and a silicon-diamine; and wherein
    said dianhydride monomer is selected from the group consisting of 3,3',4,4'-Biphenyltetracarboxylic dianhydride (BPDA), 3,3',4,4'-Benzophenone tetracarboxylic dianhydride (BTDA), 4,4'-Oxydiphthalic anhydride (ODPA), Pyromellitic dianhydride (PMDA), and 2,2'-Bis-(3,4-Dicarboxyphenyl) hexafluoropropane dianhydride (6FDA); and
        3. a quantity of particulate filler,
    B. applying said uncured solution to at least one of said surfaces;
    C. applying pressure to said bondline in a selected amount of between 0 and 100 psi; and
    D. applying heat to said bondline at a selected temperature of between 150 and 470° C., thereby converting said PAA to TPI, in situ, to form said bond.

2. The process of interface bonding of claim 1 wherein said particulate filler comprises a quantity of thermally conducting solid particulate filler in the amount of between 5 and 98% by weight.

3. The process of interface bonding of claim 1 wherein said particulate filler comprises a quantity of electrically conducting solid particulate filler in the amount of between 5 and 98% by weight.

4. The process of interface bonding of claim 1 wherein said particulate filler comprises a quantity of electrically insulating solid particulate filler in the amount of between 5 and 98% by weight.

* * * * *